United States Patent [19]
Ogushi

[11] Patent Number: 5,596,618
[45] Date of Patent: Jan. 21, 1997

[54] EXPOSURE APPARATUS AND DEVICE MANUFACTURING METHOD USING THE SAME

[75] Inventor: Nobuaki Ogushi, Yokohama, Japan

[73] Assignee: Canon Kabushiki Kaisha, Tokyo, Japan

[21] Appl. No.: 508,787

[22] Filed: Jul. 28, 1995

Related U.S. Application Data

[63] Continuation of Ser. No. 300,121, Sep. 2, 1994, abandoned.

[30] Foreign Application Priority Data

Sep. 6, 1993 [JP] Japan .................................. 5-245935
Jul. 6, 1994 [JP] Japan .................................. 6-177448

[51] Int. Cl.⁶ .................................................. G21K 5/00
[52] U.S. Cl. ........................... 378/34; 378/145; 378/151; 378/150
[58] Field of Search ............................... 378/34, 35, 159, 378/158, 147, 150, 151, 152, 153; 250/505.1; 354/226, 234, 245, 250; 355/71, 228; 359/227, 230, 232

[56] References Cited

U.S. PATENT DOCUMENTS

| | | | |
|---|---|---|---|
| 4,754,147 | 6/1988 | Maughan et al. | 378/150 |
| 4,794,629 | 12/1988 | Pastyr et al. | 378/150 |
| 4,868,844 | 9/1989 | Nunan | 378/150 |
| 5,172,402 | 12/1992 | Mizusawa et al. | 378/151 |
| 5,237,599 | 8/1993 | Gunji et al. | 378/148 |

FOREIGN PATENT DOCUMENTS

243519  9/1989  Japan .

*Primary Examiner*—Don Wong
*Attorney, Agent, or Firm*—Fitzpatrick, Cella, Harper & Scinto

[57] ABSTRACT

An exposure apparatus includes a holder for holding a substrate to be exposed, and a movable shutter movable across a path of exposure light, having an intensity distribution in a predetermined direction, and in a direction intersecting the predetermined direction, wherein the movable shutter has an edge with a protruded portion being protruded in the movement direction and having a shape and size determined on the bases of the intensity distribution of the exposure light.

13 Claims, 11 Drawing Sheets

EXPOSURE APPARATUS AND DEVICE MANUFACTURING METHOD USING THE SAME

This application is a continuation of prior application, application Ser. No., 08/300,121 filed Sep. 2, 1994, now abandoned.

FIELD OF THE INVENTION AND RELATED ART

This invention relates to an exposure apparatus of the type which uses, as illumination light, synchrotron radiation light, for example, produced from a charged particle accumulation ring.

In order to meet recent further requirements miniaturization of semiconductor devices, the development of a variety of apparatuses capable of transferring and printing patterns of a minimum linewidth of 0.24 micron for a DRAM of not less than 100 megabits, has been advanced. Among these apparatuses, an exposure apparatus of the type which uses, as illumination light, synchrotron radiation light (SR-X-ray beam) produced by a charged particle accumulation ring shows superior performance both with respect to the transferring and printing precision and with respect to the productivity, and it is considered as an effective machine.

The SR-X-ray beam is emitted from an emission point in the form of a sheet-like beam having a small thickness in a direction (Y-axis direction) perpendicular to the orbit of the charged particle accumulation ring. It is expanded in the Y-axis direction by an expanding device such as a cylindrical mirror, and then it is introduced into an exposure chamber to irradiate a mask and a substrate such as a wafer. The SR-X-ray beam expanded by a cylindrical mirror, for example, is uniform in the X-axis direction. But it has a non-uniform distribution in the Y-axis direction. Thus, it produces exposure non-uniformness. In consideration of this, a movable shutter being movable in the Y-axis direction is provided before the substrate and, by changing the movement speed of the movable shutter with time and in accordance with the intensity distribution of the SR-X-ray beam, the exposure time of the substrate is adjusted to prevent the exposure non-uniformness (Japanese Laid-Open Patent Application, Laid-Open No. 243519/1989).

SUMMARY OF THE INVENTION

With this method, however, the movement speed of the movable shutter has to be changed with time as each exposure zone of the substrate is subjected to the exposure process. This requires a large acceleration and deceleration of a driving motor of the movable shutter during the exposure process, and a large load is applied to the driving means mechanism. Also, vibration may be produced and transmitted to the substrate, which may adversely result in a transfer error (misregistration).

It is an object of the present invention to provide an exposure apparatus in which driving control of a movable shutter, for example, is easy and in which production of vibration is effectively suppressed to avoid transfer error.

In one preferred form of the invention, there is provided an exposure apparatus which comprises a holder for holding a substrate to be exposed, and a movable shutter being movable across the path of exposure light, having an intensity distribution with respect to a predetermined direction, and in a direction intersecting the predetermined direction. The movable shutter has an edge of a shape having a protrusion, protruding in the movement direction, and this protrusion has a shape and size determined on the basis of the intensity distribution of the exposure light.

With this arrangement, the amount of exposure can be made uniform throughout each exposure zone of the substrate by moving the movable shutter over the exposure zone at a constant speed or an approximately constant speed. Thus, there is no necessity of a large acceleration and deceleration of the movable shutter in each exposure zone, and the driving control is easy. Also, vibration is not easily produced, enabling high precision exposure.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 11A and 11B show a belt-like shutter to be used in place of the X-aperture stage, wherein

DESCRIPTION OF THE PREFERRED EMBODIMENTS

Preferred embodiments of the present invention will be explained in conjunction with the drawings.

Figure 1:
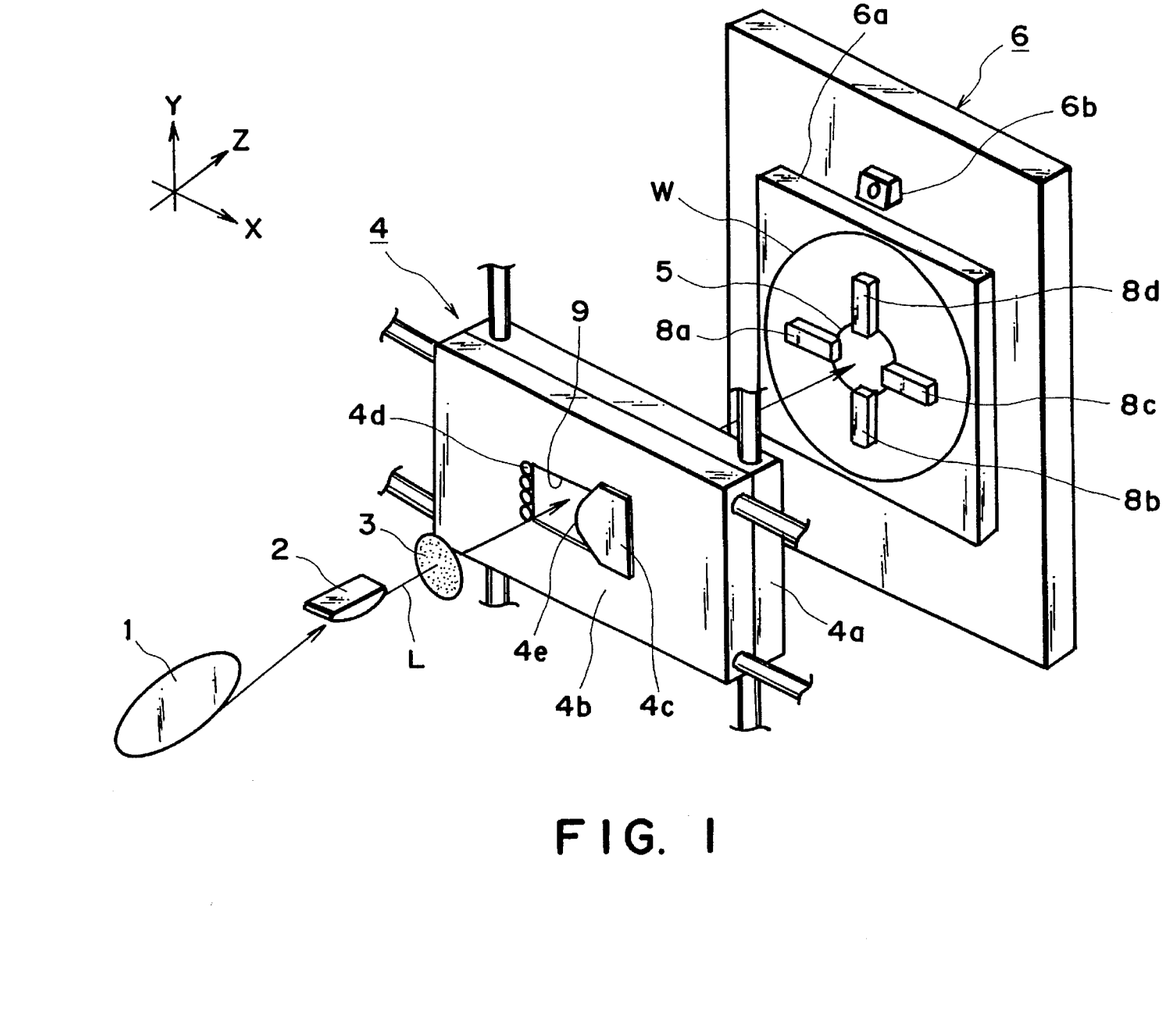
FIG. 1 is a schematic view of an exposure apparatus according to an embodiment of the present invention.

FIG. 1 is a perspective view of a first embodiment. The exposure apparatus of this embodiment comprises a cylindrical mirror 2 for expanding a sheet-like SR-X-ray beam L (synchrotron radiation light) (illumination light), emitted from an emission point 1 of a charged particle accumulation ring, in the direction of the thickness thereof (Y-axis direction); an unshown exposure chamber having a beryllium window 3 for transmitting the SR-X-ray beam; an exposure amount controlling device 4 disposed within the exposure chamber; a mask 5 held by an unshown holding device; and a wafer stage 6 for holding a wafer W. The wafer stage 6 is movable along a plane perpendicular to the optical axis of the SR-X-ray beam L, and it serves to hold the wafer W at a position spaced by about 30 microns from the mask 5 and in parallel to the mask 5. Mounted on the wafer stage 6 is an X-ray detector 6b. The X-ray beam intensity distribution within the exposure angle can be measured by this detector by scanningly moving the wafer stage 6. The wafer W can be attracted to an attracting chuck 6a mounted on the wafer stage 6.

In operation, the wafer stage 6 is moved along a plane perpendicular to the optical axis of the SR-X-ray beam L impinging on the wafer W, in the Y-axis direction and in a direction orthogonal thereto (X-axis direction), so as to move stepwise each exposure zone of the wafer W to the plane of irradiation of the SR-X-ray beam L. Any positional deviation between the pattern of the mask 5 and each exposure zone of the wafer W can be detected by alignment optical systems 8a–8d, and the wafer W can be finally positioned by actuating the aforementioned driving mechanism of the wafer stage 6 or an unshown fine-motion adjusting mechanism.

The SR-X-ray beam L, being expanded by the cylindrical mirror 2, has a non-uniform intensity distribution similar to a Gaussian distribution, with respect to the Y-axis direction (predetermined direction). It is directed through the beryllium window 3 and then into the exposure chamber. It goes via the exposure amount controlling device 4 and the mask 5, and it impinges on the wafer W. By this, the pattern of the mask 5 is transferred and printed on the wafer.

Figure 2:
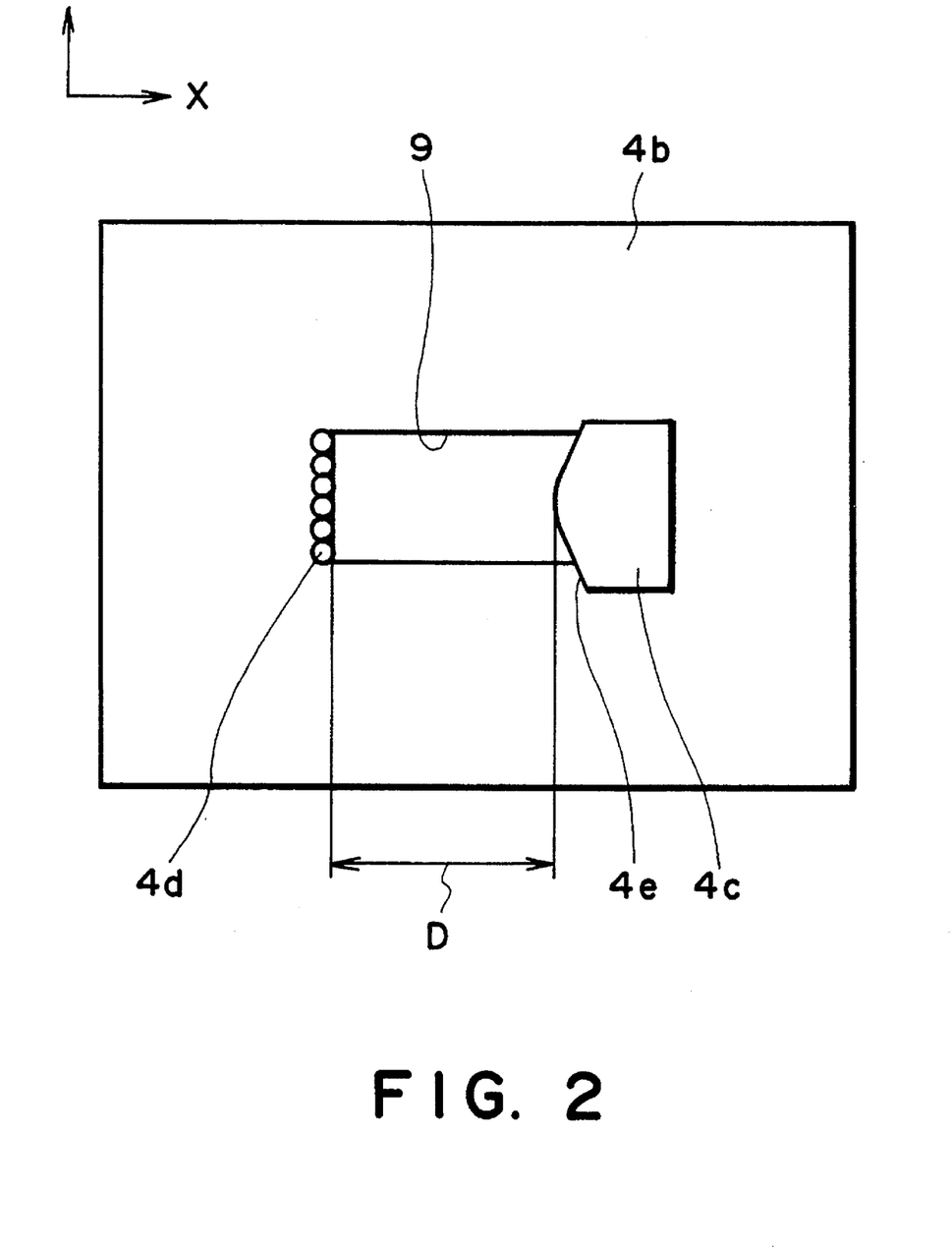
FIG. 2 is an elevational view of an X-aperture stage of the FIG. 1 apparatus.

The exposure amount controlling device 4 comprises a Y-aperture stage 4a being movable and adjustable in the Y-axis direction; an X-aperture stage 4b which is an aperture stage being reciprocally movable in the X-axis direction along the Y-aperture stage 4a; an unshown scanning mechanism comprising driving means for scanningly moving the X-aperture stage 4b in the X-axis direction; an aperture movable member (protruded member) 4c which is supported and is movable and adjustable in the X-axis direction along the X-aperture stage 4b; and an X-ray detector array (detecting means) 4d disposed along the Y-axis direction upon the X-aperture stage 4b. The X-aperture stage 4b has an aperture 9 of substantially rectangular shape for passing the SR-X-ray beam L. The Y-aperture stage 4a has a large aperture (not shown) of a size not blocking the path of the SR-X-ray beam regardless of the movement of the same to any position on the Y-axis direction. Formed at an end edge of the aperture movable member 4c in the X-axis direction is a protruded portion 4e, protruding toward the aperture 9. It has a shape which is determined on the basis of the X-ray intensity distribution $I_0(y)$ of the SR-X-ray beam measured beforehand. It serves to change the aperture width D (FIG. 2) of the aperture 9 in the X-axis direction, in accordance with a predetermined pattern and in the Y-axis direction.

For exposure of each exposure zone of the wafer W, the X-aperture stage 4b is scanningly moved in the X-axis direction at a predetermined scan speed V to adjust the exposure time and to avoid exposure non-uniformness due to the X-ray intensity distribution $I_0(y)$ of the SR-X-ray beam. This will be explained in more detail, below.

On the surface of the wafer W, there is a relation such as below among the exposure amount $E(y)$ at a certain position in the Y-axis direction, the X-ray intensity $I(y)$ of the SR-X-ray beam and the exposure time $T(y)$:

$$E(y)=I(y)\cdot T(y) \quad (1)$$

Also, the following relation lies among the exposure time $T(y)$, the aperture width $D(y)$ of the aperture 9 of the X-aperture stage 4b in the X-axis direction and the scan speed V of the X-aperture stage 4b:

$$T(y)=D(y)/V \quad (2)$$

From equations (1) and (2), it follows that:

$$E(y)=I(y)\cdot D(y)/V \quad (3)$$

Figure 3:
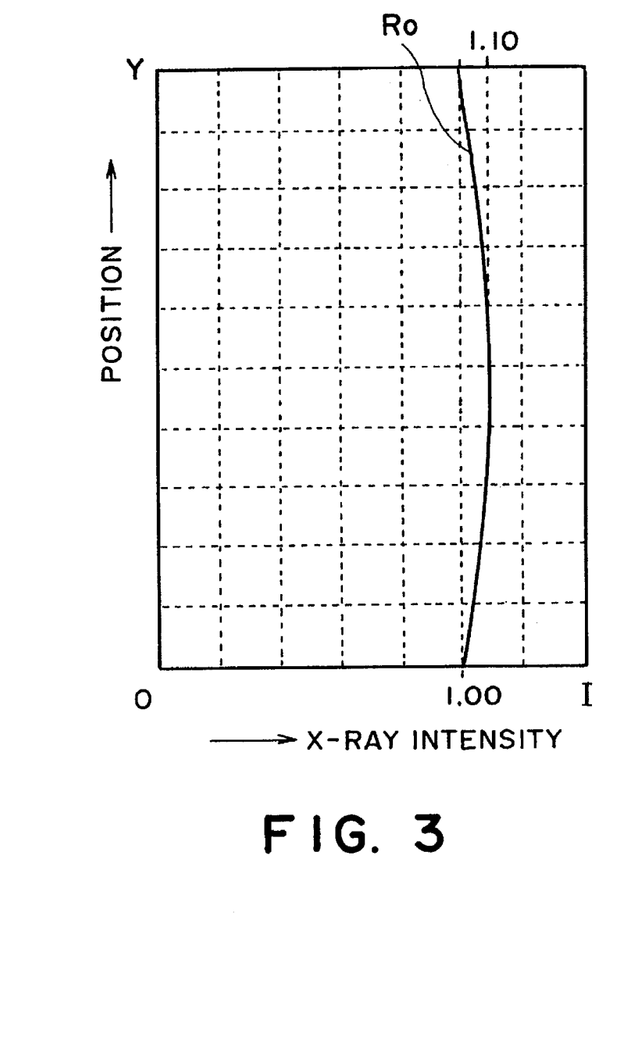
FIG. 3 is a graph showing an X-ray beam intensity distribution.

For example, if the X-ray intensity distribution $I_0(y)$ of the SR-X-ray beam in the Y-axis direction such as represented by a curve $R_0$ in FIG. 3 wherein the intensity is highest at the central portion in the Y-axis direction, about 1.10 times higher as compared with the lowest level at the opposite end portions thereof, then the shape and the amount of protrusion of the protruded portion 4e of the aperture movable member 4c are set so that the aperture width $D(y)$ of the aperture 9 of the X-aperture stage 4b in the X-axis direction changes in accordance with a curve $S_0$ (FIG. 4) wherein the width is smallest at the central portion with respect to the Y-axis direction, about 0.91 times of the largest width at the opposite end portions. Then, for each exposure cycle, the X-aperture stage 4b is scanningly moved at the predetermined speed V. By this, from equation (3), the exposure amount $E(y)$ upon the wafer W surface becomes uniform at any position along the Y-axis direction, and occurrence of exposure non-uniformness is prevented. Since the scan speed V of the X-aperture stage 4b is substantially constant, there is no necessity of a large acceleration and deceleration of the driving motor of the X-aperture stage 4b. Thus, there is substantially no possibility of transfer error due to vibration attributable to such acceleration and deceleration of the driving motor.

The X-ray detector array 4d serves to measure the X-ray intensity distribution $I(y)$ of the SR-X-ray beam L in the Y-axis direction each time the X-ray aperture stage 4b is scanned. If the path or X-ray intensity of the SR-Xray beam L changes during repetition of exposure cycle, such a change is fed back so as to change the Y-axis position of the X-aperture stage 4b, the X-axis position of the aperture movable member 4c on the X-aperture stage 4b and/or the scan speed V of the X-aperture stage 4b on the basis of outputs of the X-ray detector array 4d. By this, it is possible to prevent a change in exposure amount or non-uniform exposure, over the whole wafer W surface.

If the change in intensity or intensity distribution of the SR-X-ray beam L is slow as compared with the exposure time, the X-ray detector 6b may be scanned in the Y-axis direction to measure the X-ray intensity distribution beforehand. On that occasion, the X-ray detector array 4d may be omitted.

Now, the manner of making the exposure amount uniform will be explained.

If the path of the SR-X-ray beam L shifts in the Y-axis direction, a deviation $\Delta y$ in the Y-axis direction (hereinafter "y-offset") of the peak position of the output of the X-ray detector array 4d may be detected and the Y-aperture stage 4a may be moved in the Y-axis direction by Δy. By this, the aperture 9 of the X-aperture stage 4b is moved in the same direction by the same amount.

Figure 5:
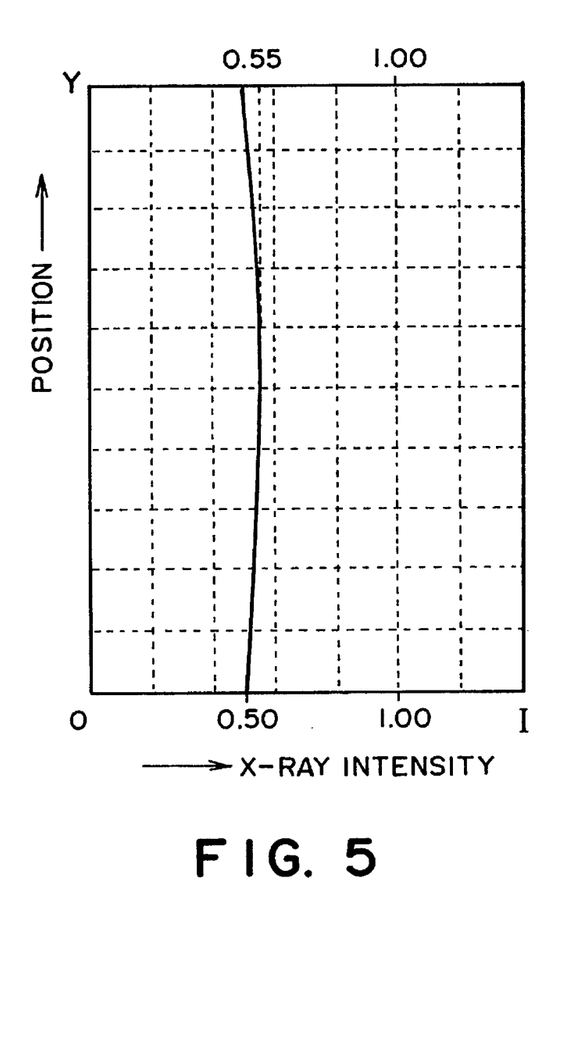
FIG. 5 is similar to FIG. 3, but showing an X-ray beam intensity distribution wherein the distribution is lowered generally to about a half as compared with that of FIG. 3.

If, as shown in FIG. 5, the X-ray intensity I of the SR-X-ray beam L decreases generally to about a half, for example, the scan speed of the X-aperture stage 4b may be controlled and decreased to a half. This effectively avoids a change in exposure amount.

Figure 6:
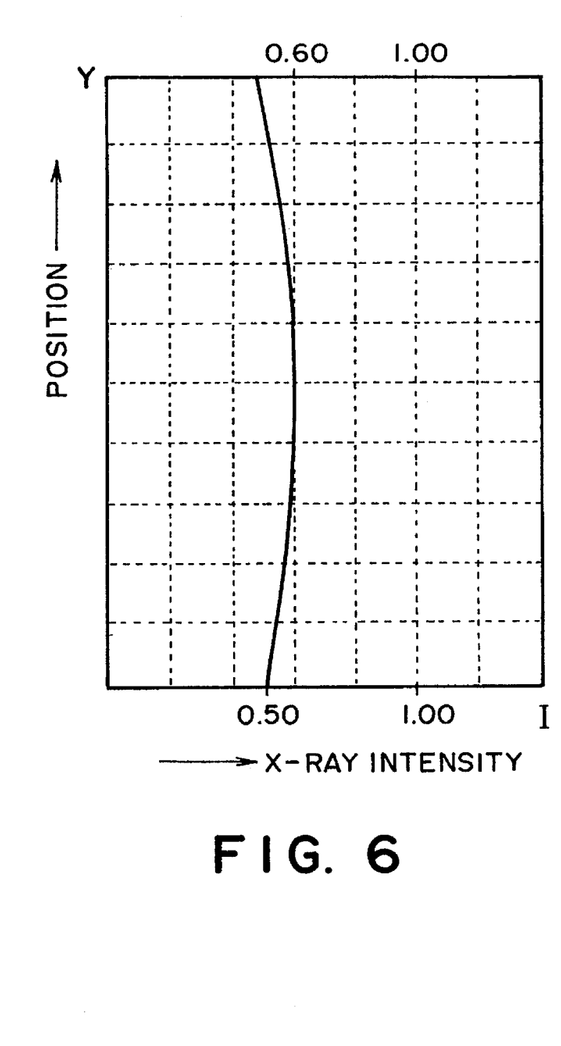
FIG. 6 is similar to FIG. 3, but showing an X-ray beam intensity distribution wherein the distribution is lowered generally and locally as compared with that of FIG. 3.

If, as shown in FIG. 6, the X-ray intensity of the SR-X-ray beam L decreases generally to about a half and, additionally, the X-ray intensity distribution I(y) changes locally such that the highest level in the central portion becomes 0.60 while the lowest level at the opposite end portions becomes 0.50, then the scan speed of the X-aperture stage 4b may be decreased while the aperture movable member 4c may be moved in the X-axis direction along the X-aperture stage 4b, to avoid a change in exposure amount over the whole wafer surface and to minimize non-uniformness of exposure. The movement amount of the aperture movable member on the X-aperture stage 4b can be calculated as follows:

From equation (3), the condition for attaining the same exposure amount with the central portion of and with the opposite end portions of the SR-X-ray beam impinging on the wafer W surface, is:

$$0.60 \cdot Dm = 0.05 \cdot (Dm + De) \qquad (4)$$

where Dm is the aperture width of the central portion in the Y-axis direction of the aperture 9, and De is the amount of protrusion in the X-axis direction of the central portion, in the Y-axis direction, of the aperture movable member 4c.

Figure 4:
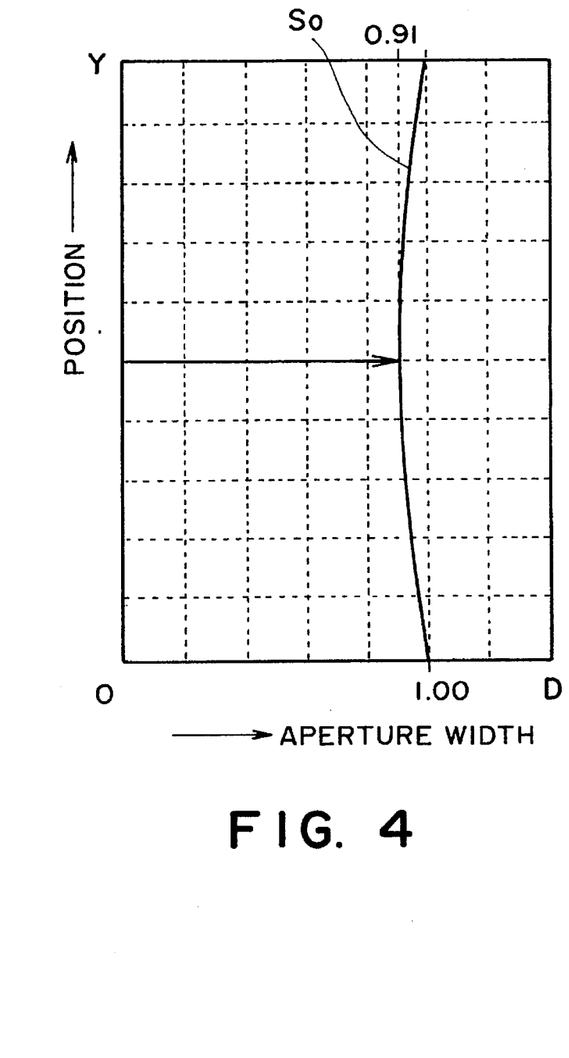
FIG. 4 is a graph showing changes in aperture width of the X-aperture stage in the Y-axis direction.

From FIG. 4. De=0.09. Substituting this into equation (4) to calculate Dm, if follows that:

$$Dm = 0.45$$

Figure 7:
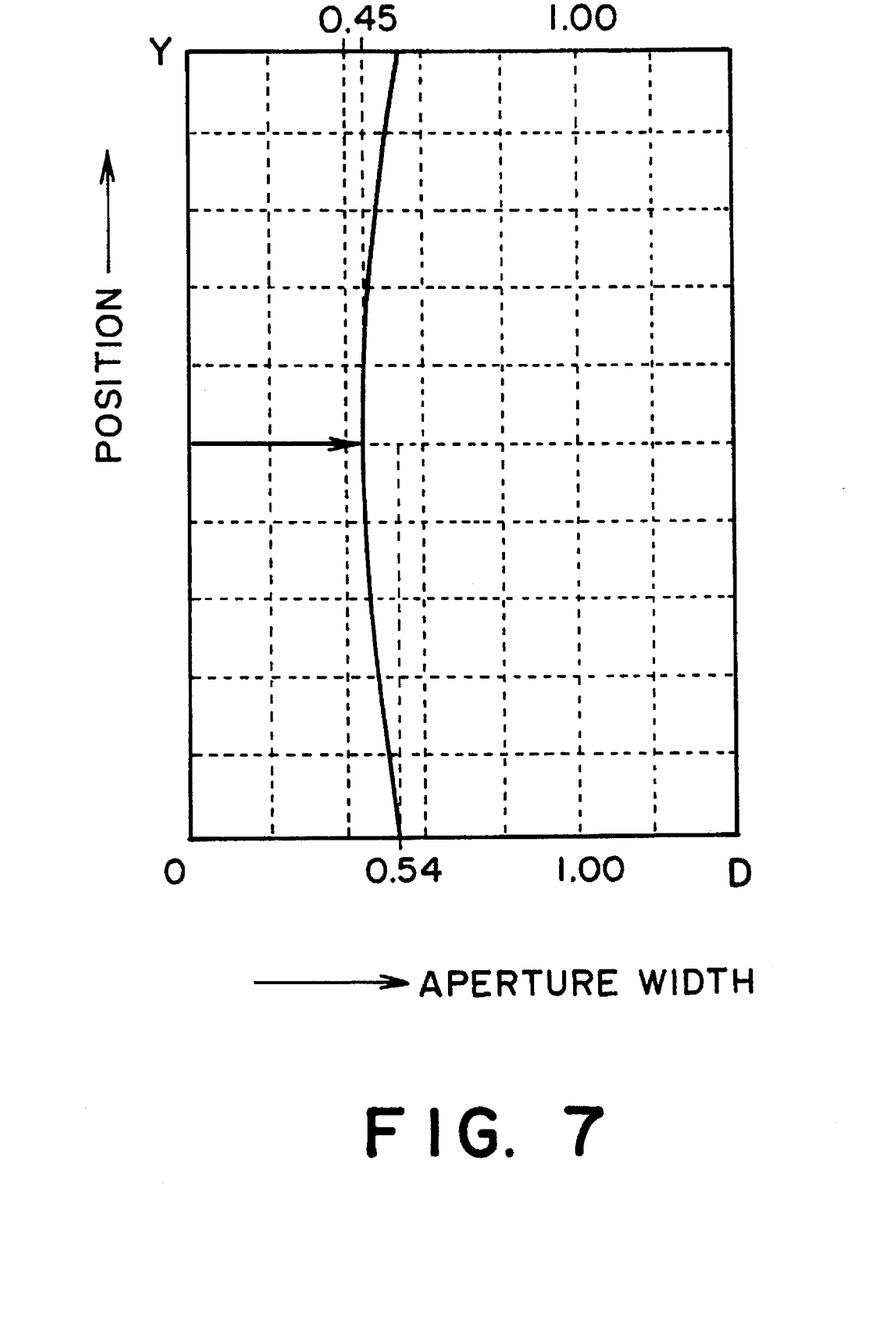
FIG. 7 is a graph showing the aperture width of the X-aperture state, being changed in accordance with the X-ray beam intensity distribution of FIG. 6.

Namely, it is seen that, from the state of FIG. 4, the aperture movable member 4c may be moved in the X-axis direction until, as shown in FIG. 7, the aperture width Dm at the central portion in the Y-axis direction of the aperture 9 becomes equal to 0.45. Here, the scan speed of the X-aperture stage 4b is decreased to 0.27 times.

Figure 8:
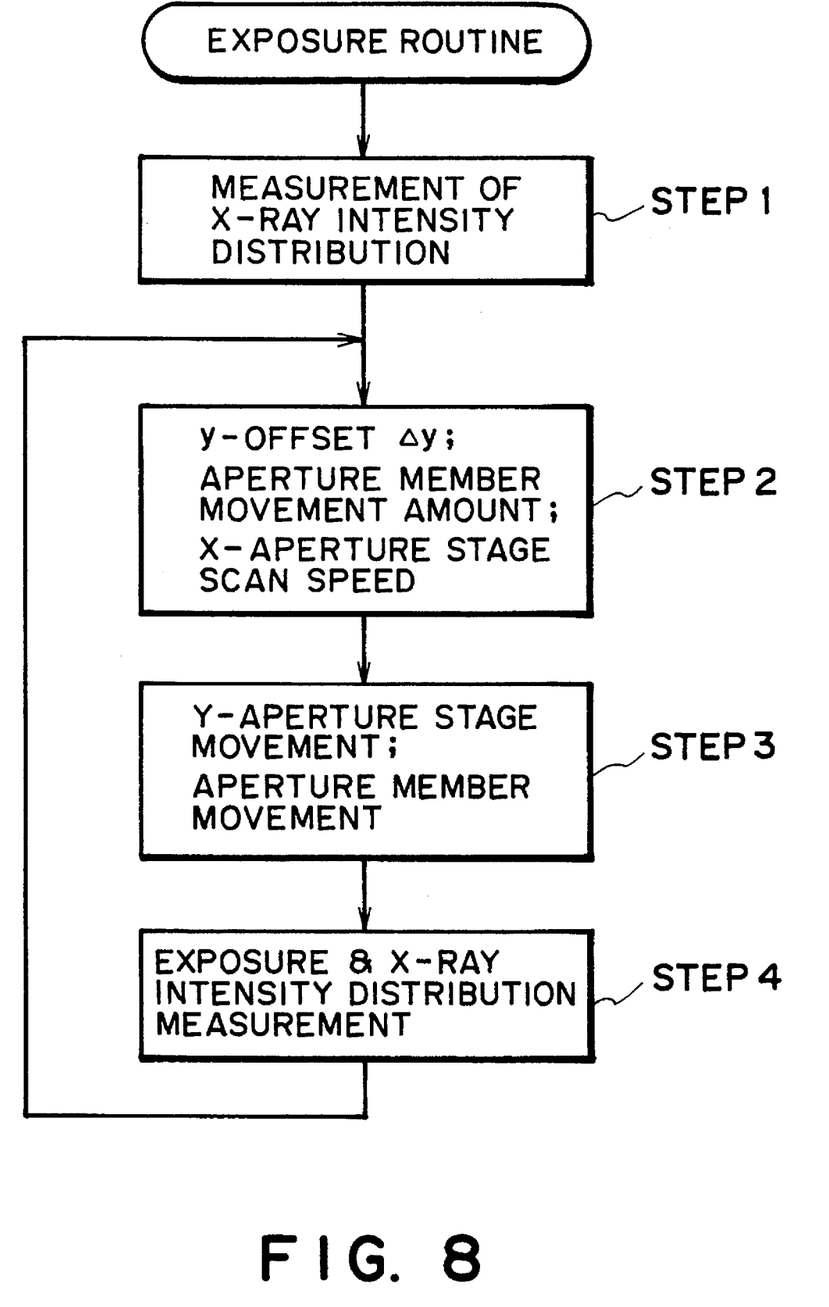
FIG. 8 is a flow chart of the sequence of exposure time adjustment for each exposure cycle.

FIG. 8 shows the sequence of measurement of the X-ray intensity distribution I(y) of the SR-X-ray beam L for each exposure cycle as well as adjustment of the exposure amount based on the output of the measurement. Initially, before the start of the exposure process, the X-aperture stage 4b is scanned in the X-axis direction and the X-ray intensity distribution I(y) of the SR-X-ray beam L is measured by using the X-ray detector array 4d (Step 1). The measured intensity distribution is compared with the X-ray intensity distribution $I_0(y)$, having been measured beforehand. Then, a deviation in the Y-axis direction between the peaks of them (i.e., y-offset) and the movement amount of the aperture movable member on the X-aperture stage 4b in the X-axis direction as well as the scan speed of the X-aperture stage 4b for the subsequent exposure cycle are calculated (Step 2). On the basis of the thus calculated y-offset and movement amount of the aperture movable member 4c, the Y-aperture stage 4a and the aperture movable member 4c are moved, respectively (Step 3). Then, the subsequent exposure cycle starts, and the X-aperture stage 4b is scanned. Here, the scan speed is controlled to the level as calculated at Step 2 (Step 4). With the scan of the X-aperture stage 4b, a change in the X-ray intensity distribution I(y) of the SR-X-ray beam L is measured by the X-ray detector array 4d, and Step 2 to Step 4 are repeated.

Figure 9:
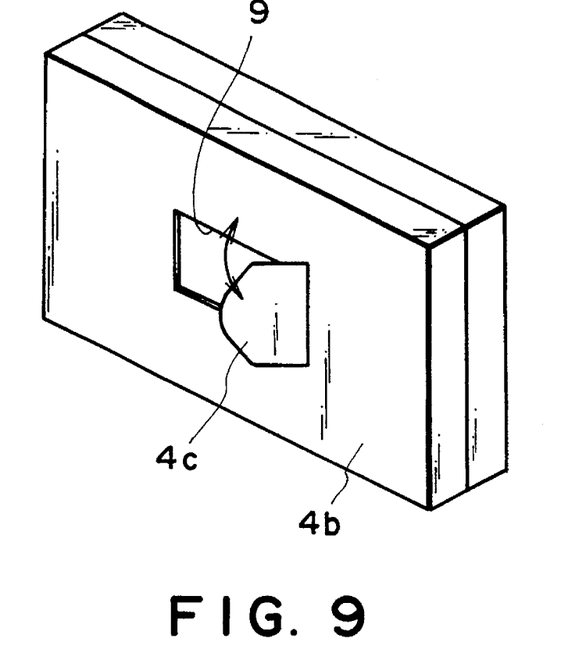
FIG. 9 is a perspective view of an aperture movable member of the X-aperture stage, the aperture movable member being pivotally moved.
Figure 10:
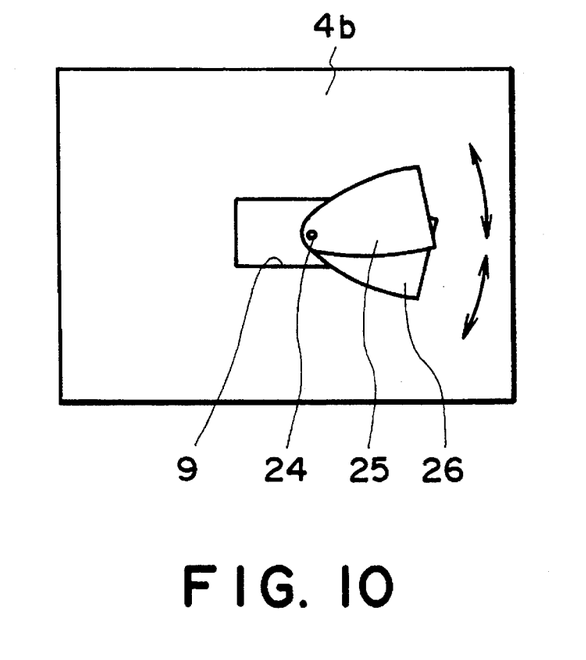
FIG. 10 is an elevational view showing a case where two pivotal plates are used in place of the aperture movable member of the X-aperture stage.
Figure 11A:
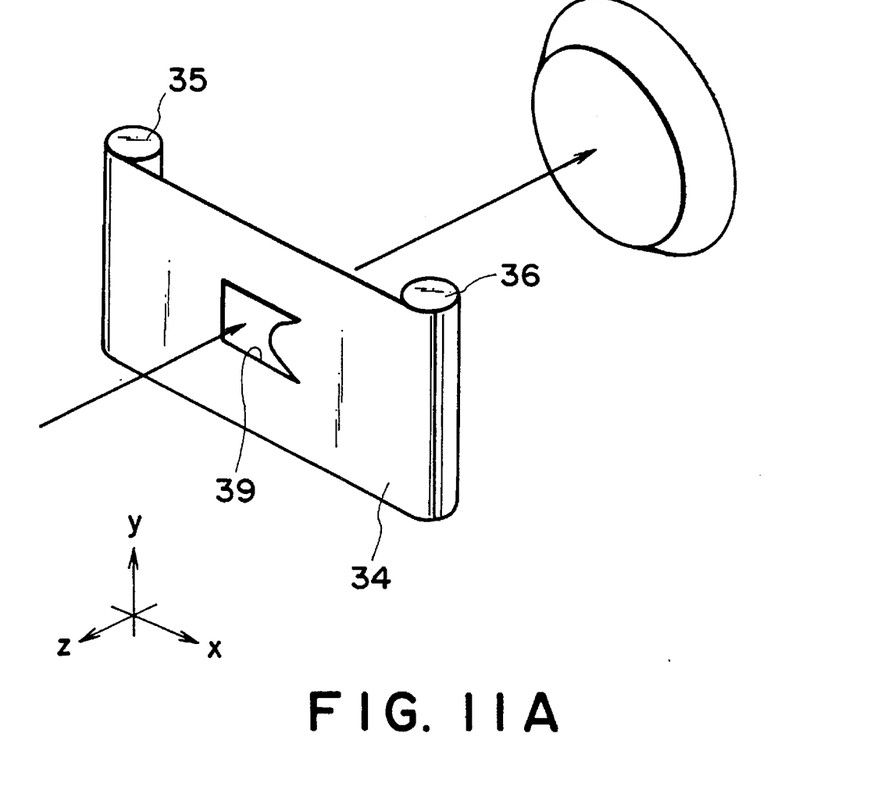
FIG. 11A is a perspective view and FIG. 11B is a fragmentary elevational view, a portion of the shutter being rewound.
Figure 11B:
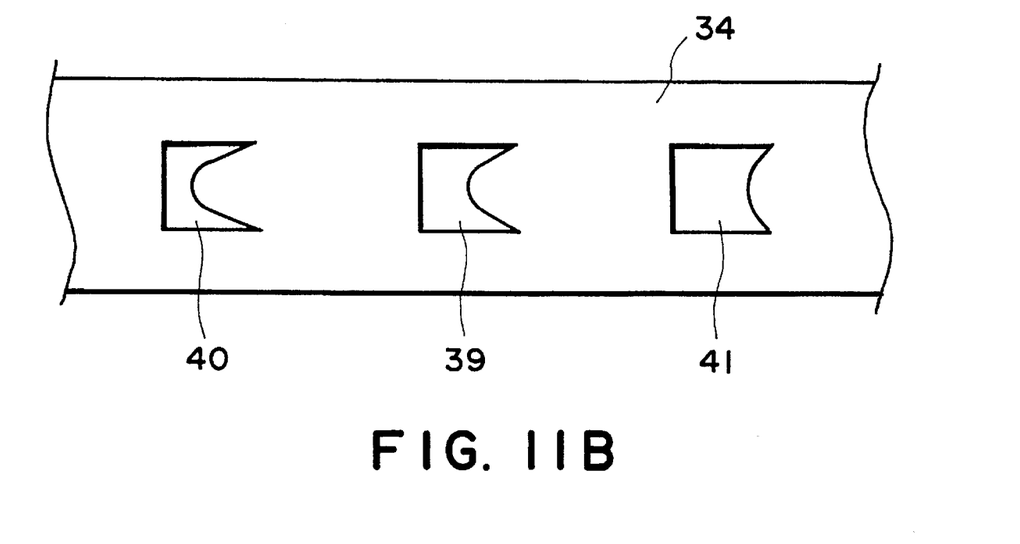

It is to be noted that, when the X-ray intensity distribution I(y) of the SR-X-ray beam L changes locally, the aperture movable member 4c may be pivotally moved about a predetermined axis such as shown in FIG. 9, in place of moving the same in the X-axis direction, to thereby reduce non-uniformness of exposure. Alternatively, in place of using the aperture movable member 4c being movable along the X-axis direction, two pivotal plates 25 and 26 (FIG. 10) being pivotally mounted to each other by a pivot pin 24 may be provided, such that the angle of rotation of them may be changed in accordance with the change in the X-ray intensity distribution I(y) of the SR-X-ray beam L. As a further alternative, in place of using X-aperture stage 4b, a belt-like shutter 34 (FIG. 11A) of a sheet-like member having an aperture 39 similar to the aperture 9 may be used. The shutter 34 may be scanned in the X-axis direction by rotating a pair of rolls 35 and 36 around which end edges of the shutter 34 may be wound. As best shown in Figure 11B, the shutter 34 may be provided with second and third apertures 40 and 41 of different aperture shapes. When the X-ray intensity distribution I(y) of the SR-X-ray beam L changes locally, an appropriate one of these apertures 40 and 41 may be selected and used.

Figure 12:
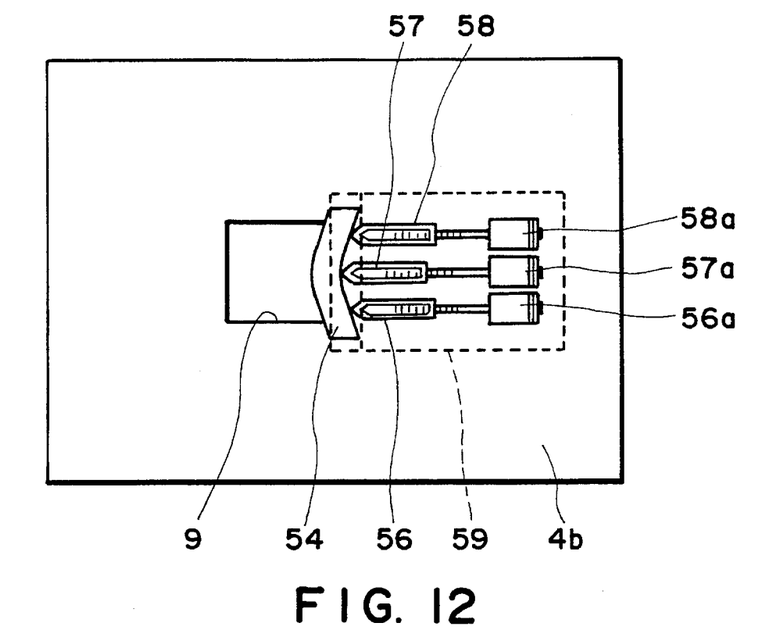
FIG. 12 is an elevational view showing an example wherein an elastic or resilient member and pushing rods are used in place of the aperture movable member of the X-aperture stage.

As a still further alternative, in place of using the aperture movable member 4c being movable in the X-axis direction, an arrangement shown in FIG. 12 may be used: which comprises a belt-like elastic or resilient member 54 being able to protrude into an end edge portion of the aperture 9 of the X-aperture stage, in the X-axis direction; a plurality of pushing rods 56–58 for changing the amount of protrusion of the resilient member 54; and actuators 56a–58a for actuating the pushing rods individually. When the X-ray intensity distribution I(y) of the SR-X-ray beam L changes locally, the pushing rods 56–58 may be actuated correspondingly to deform the elastic member 54 appropriately to prevent non-uniformness of exposure.

Figure 13:
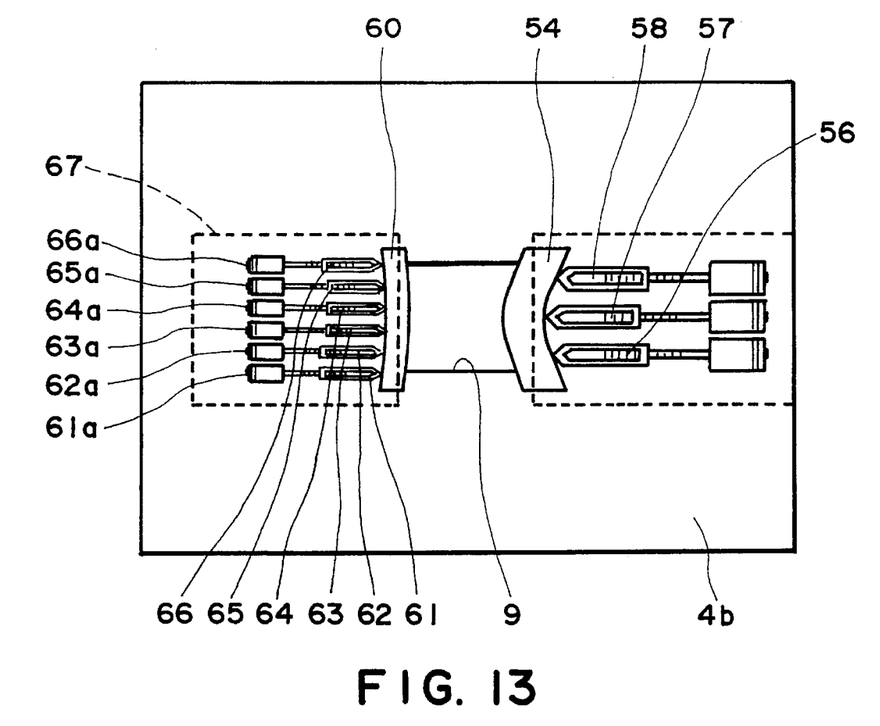
FIG. 13 is an elevational view of a modified form of the FIG. 12 example.

Further, as shown in FIG. 13, a second elastic or resilient member 60 separate from the resilient member 54 may be added and disposed so as to be opposed to the resilient member 54. By deforming the resilient member 60 with its pushing rods 61–66 and their actuators 61a–66a, higher precision in the correction of exposure amount is assured.

Next, an embodiment of a semiconductor device manufacturing method using the exposure apparatus described hereinbefore will be explained.

Figure 14:
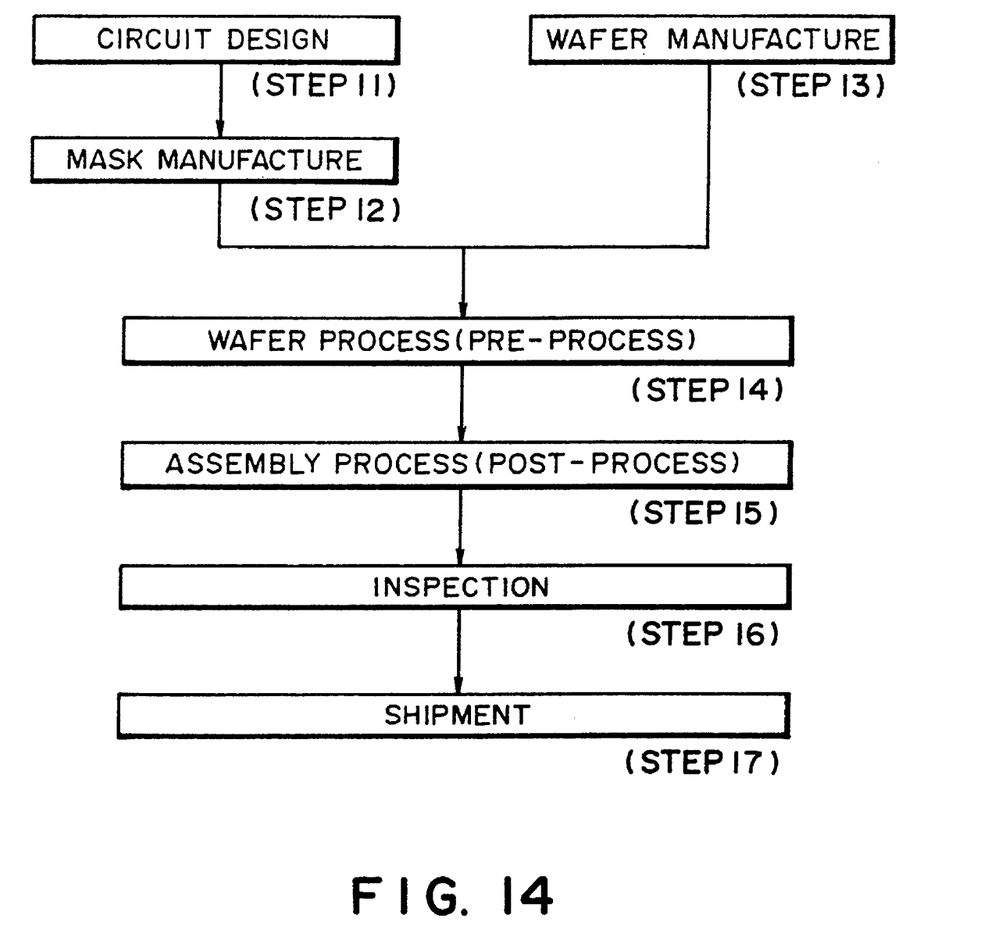
FIG. 14 is a flow chart of a sequence of semiconductor device manufacturing processes.

FIG. 14 is a flow chart of the sequence of manufacturing a semiconductor device such as a semiconductor chip (e.g. IC or LSI), a liquid crystal panel or a CCD, for example. Step 11 is a design process for designing the circuit of a semiconductor device. Step 12 is a process for manufacturing a mask on the basis of the circuit pattern design. Step 13 is a process for manufacturing a wafer by using a material such as silicon.

Step 14 is a wafer process which is called a pre-process wherein, by using the so prepared mask and wafer, circuits are practically formed on the wafer through lithography. Step 15 subsequent to this is an assembling step which is called a post-process wherein the wafer processed by Step 14 is formed into semiconductor chips. This step includes assembling (dicing and bonding) and packaging (chip sealing). Step 16 is an inspection step wherein operability check, durability check and so on of the semiconductor devices produced by Step 15 are carried out. With these processes, semiconductor devices are finished and they are shipped (Step 17).

Figure 15:
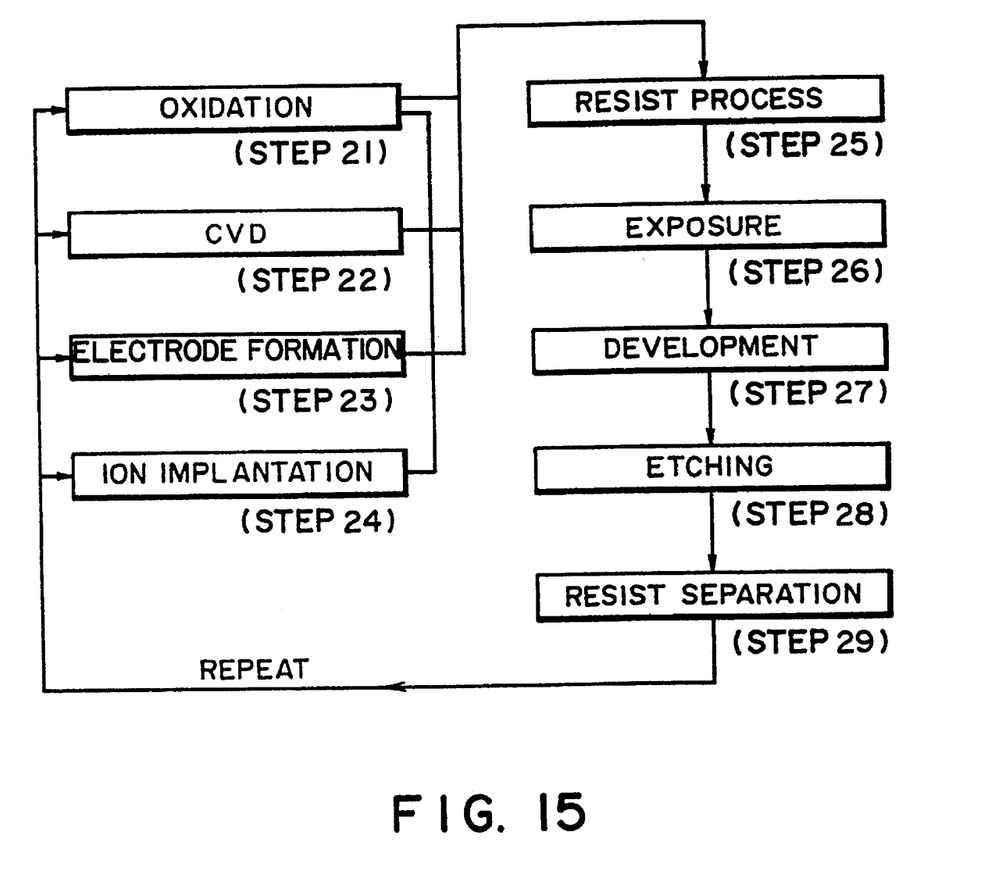
FIG. 15 is a flow chart of a sequence of a wafer process.

FIG. 15 is a flow chart showing details of the wafer process. Step 21 is an oxidation process for oxidizing the surface of a wafer. Step 22 is a CVD process for forming an insulating film on the wafer surface. Step 23 is an electrode forming process for forming electrodes on the wafer by vapor deposition. Step 24 is an ion implanting process for implanting ions to the wafer. Step 25 is a resist process for applying a resist (photosensitive material) to the wafer. Step 26 is an exposure process for printing, by exposure, the circuit pattern of the mask on the wafer through the exposure apparatus described above. Step 27 is a developing process for developing the exposed wafer. Step 28 is an etching process for removing portions other than the developed resist image. Step 29 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
    a holder for holding a substrate to be exposed; and
    a movable shutter movable across a path of exposure light, having an intensity distribution in a predetermined direction, and in a direction intersecting the predetermined direction;
    wherein said movable shutter has an edge with a protruded portion being protruded in the movement direction and having a shape and size determined on the bases of the intensity distribution of the exposure light.

2. An apparatus according to claim 1, wherein the exposure light comprises synchrotron radiation light.

3. An apparatus according to claim 2, wherein the exposure light comprises sheet-like synchrotron radiation light expanded by a mirror in a particular direction, and wherein the exposure light has a predetermined intensity distribution with respect to the particular direction.

4. An apparatus according to claim 1, wherein said movable shutter moves substantially at a constant speed, within an exposure region.

5. An apparatus according to claim 1, wherein said movable shutter is arranged to change at least one of the shape and size of the protruded portion.

6. An apparatus according to claim 1, further comprising detecting means for detecting the intensity distribution of the exposure light.

7. An apparatus according to claim 6, further comprising means for changing at least one of the shape and size of the protruded portion of said movable shutter in response to an output of said detecting means.

8. An apparatus according to claim 6, wherein said detecting means is movable as a Unit with said movable shutter.

9. A device manufacturing method, comprising the steps of:
    moving a movable shutter across a path of exposure light, having an intensity distribution in a predetermined direction, and in a direction intersecting the predetermined direction;
    wherein the movable shutter has an edge with a protruded portion being protruded in the movement direction and having a shape and size determined on the basis of the intensity distribution of the exposure light; and
    projecting, onto a substrate to be exposed, the exposure light passing through the movable shutter.

10. A method according to claim 9, wherein the substrate comprises a wafer and wherein a pattern of a mask is transferred to the wafer through said projection of the exposure light.

11. An exposure apparatus for manufacturing a semiconductor device, said apparatus comprising:
    a holder for holding a wafer to which a pattern is to be transferred by exposure;
    a movable shutter, movable across a path of an exposure beam having an intensity distribution, for adjusting the exposure so as to provide a uniform exposure amount within a region of the wafer to which the pattern is to be transferred; and
    a mechanism for changing an edge shape of said movable shutter.

12. An apparatus according to claim 11, wherein the exposure beam comprises synchrotron radiation.

13. An exposure apparatus for manufacturing a semiconductor device, said apparatus comprising:
    a holder for holding a wafer to which a pattern is to be transferred by exposure;
    shielding means, having an opening for partially blocking synchrotron radiation, for adjusting the exposure so as to provide a uniform exposure amount within a region of the wafer to which the pattern is to be transferred; and
    a mechanism for changing an edge shape of the opening of said shielding means.

* * * * *

UNITED STATES PATENT AND TRADEMARK OFFICE
CERTIFICATE OF CORRECTION

PATENT NO. : 5,596,618
DATED : January 21, 1997
INVENTOR(S) : Nobuaki OGUSHI

It is certified that error appears in the above-indentified patent and that said Letters Patent is hereby corrected as shown below:

COLUMN 1:

Line 15, "requirements" should read --requirements for--.

COLUMN 5:

Line 33, "if" should read --it--.

COLUMN 8:

Line 4, "Unit" should read --unit--.

Signed and Sealed this

First Day of July, 1997

Attest:

BRUCE LEHMAN

Attesting Officer     Commissioner of Patents and Trademarks